United States Patent [19]

Shirling

[11] Patent Number: 4,943,846
[45] Date of Patent: Jul. 24, 1990

[54] PIN GRID ARRAY HAVING SEPERATE POSTS AND SOCKET CONTACTS

[75] Inventor: David J. Shirling, Waterbury, Conn.
[73] Assignee: AMP Incorporated, Harrisburg, Pa.
[21] Appl. No.: 433,830
[22] Filed: Nov. 9, 1989
[51] Int. Cl.$^5$ .................. H01L 23/14; H01L 23/12; H01L 23/54
[52] U.S. Cl. ........................ 357/80; 357/68; 357/74
[58] Field of Search .............. 357/80, 68, 74, 75, 357/70; 361/420, 412, 413, 414, 416; 174/262, 263, 264, 265; 439/45, 46, 47, 48, 49, 50, 74, 75

[56] References Cited

U.S. PATENT DOCUMENTS

| | | | |
|---|---|---|---|
| 3,496,634 | 2/1970 | Kurtz et al. | 439/75 |
| 3,698,083 | 10/1972 | Schreck | 174/265 |
| 4,082,394 | 4/1978 | Gedney et al. | 357/75 |
| 4,552,422 | 11/1985 | Bennett et al. | 439/75 |
| 4,620,757 | 11/1986 | Thevenz | 439/74 |
| 4,652,065 | 3/1987 | Cassinelli | 361/414 |
| 4,677,526 | 6/1987 | Muehling | 357/70 |

Primary Examiner—Rolf Hille
Assistant Examiner—S. V. Clark
Attorney, Agent, or Firm—Robert W. Pitts

[57] ABSTRACT

Pin grid array has plate-like insulating support having oppositely facing first and second major surfaces. A plurality of first holes extend through the support on a first gird and a plurality of second holes extend through the support on a second grid which is displaced in the X and Y directions from the first grid. Each first hole contains a seamless socket contact and each second hole has mounted therein a post which extends beyond the second surface of the support. Each socket contact in a first hole is associated with a post mounted in an adjacent hole and a surface conductor extends from each socket contact to is associated post. The holes are plated through and the socket contacts are electrically connected to their associated posts by solder connections. A lower profile of the pin grid array when it is mounted on the circuit board is achieved along with other advantages.

7 Claims, 3 Drawing Sheets

PIN GRID ARRAY HAVING SEPERATE POSTS AND SOCKET CONTACTS

FIELD OF THE INVENTION

This invention relates to pin grid arrays and particlarly to an improved pin grid array which has a lower profile, when installed on a circuit board, than a conventional pin grid array.

BACKGROUND OF THE INVENTION

The term "pin grid array" is generally understood to describe a connecting device for connecting the leads from a component to conductors on a circuit board. The pin grid array comprises a plate-like insulating member having oppositely facing major surfaces and having a plurality of holes extending through the insulator with the holes located in accordance with a pin grid pattern. Each of the holes has a socket assembly mounted therein, each socket assembly having a receptacle portion which is adjacent to the first surface of the insulator and a post portion extending from the second surface. The post portion is of reduced diameter, relative to the socket portion, and is intended to be wave soldered to a conductor on the circuit board. The receptacle portion receives a lead from the component when the component, with a plurality of leads extending therefrom, is coupled to the pin grid array.

The socket assemblies are sometimes manufactured as one piece stamped and formed members with the post members integral with the socket members. A problem sometimes encountered with stamped and formed socket devices is that when the pin grid array is mounted on the circuit board, and the post members are wave soldered to the circuit board conductors, the solder may move into the receptacle portions of the socket members by capillary action. The socket or receptacle portion has spring members therein which are intended to establish contact with the component leads and if these spring members are soldered to each other, the socket portion cannot function as it is intended. The higher quality socket assemblies used in pin grid arrays commonly comprise two parts, a separate socket contact or receptacle contact and an enclosure for the socket which may be referred to as a cup. The enclosure has a cylindrical portion which is mounted in the hole in the insulating body and an integral post which extends from the insulating body, the separate socket contact being contained in the enclosure or cup. The highest quality socket assemblies have seamless (rather than stamped and formed) receptacle contacts therein which are manufactured by screw machine methods or by drawing. Because of the fact that the seamless contact socket is contained in an enclosure, there is no possibility for solder to travel into the contact socket area and interfere with its intended function.

Composite socket devices as described above thus have a relatively large diameter portion which receives the seamless contact member and a greatly reduced diameter integral post portion. The relatively large diameter portion which receives the contact socket must be of some minimum length which is substantially greater than the length as measured along the center line thereof of the seamless socket member for the reason that when a component lead is inserted into one of the composite socket devices, sufficient space must be allowed for the lead to pass through the seamless contact member and permit it to extend for a distance beyond the spring tynes of the contact member. This requirement in effect determines the minimum height of the pin grid array when the pin grid array is mounted on a circuit board and under some circumstances, it would be highly desirable to reduce the distance between the surface of the circuit board and the surface of the pin grid array which is opposed to the component when the component is coupled to the pin grid array. In other words, it would be desirable to reduce the profile of the pin grid array with respect to the surface of the circuit board.

THE INVENTION

A pin grid array in accordance with the present invention comprises an insulating support having oppositely facing first and second major surfaces. A plurality of first plated-through holes extend through the support on a first grid system and each hole contains a seamless socket contact which is adjacent to the first surface. A second plurality of plated-through holes extend through the insulating support on a second grid which is offset from the first grid. Surface conductors on one of the surfaces of the support extend between each first hole and an associated second hole. Each second hole contains a post member which has one end which is adjacent to the first surface of the support and another end which is spaced from the second surface of the support. The posts are intended for wave soldering to conductors on a circuit board or alternatively, may be of a rectangular cross-section so that conductors can be connected to the posts by wrap-type connections. By virtue of the fact that the posts are offset from the socket contacts, there is no possibility of solder traveling by capillary action into the spring tynes of the sockets when the posts are soldered to circuit board conductors. Additionally, and by virtue of the fact that the seamless socket contacts are not contained in an enclosure such as a cup having an integral post, the pin grid array can be mounted on a circuit board with the insulator relatively closer to the surface of the circuit board than is possible with prior art devices.

THE DRAWING FIGURES

THE DISCLOSED EMBODIMENT

Figure 1:
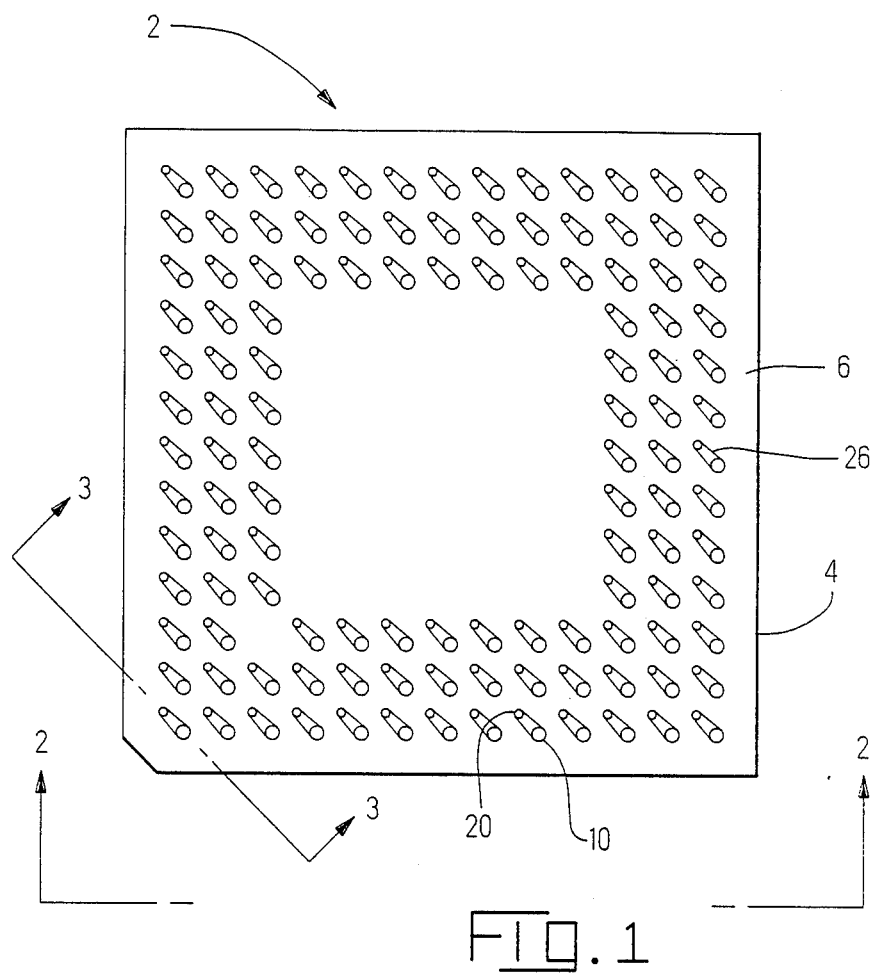
FIG. 1 is a top plan view of a pin grid array in accordance with the invention.
Figure 2:
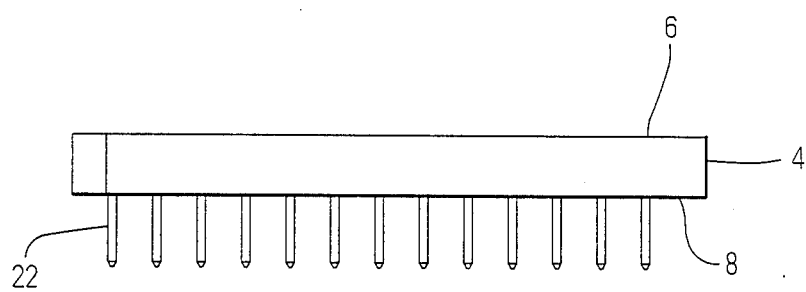
FIG. 2 is a side view looking in the direction of the arrows 2—2 on FIG. 1.

A pin grid array 2 in accordance with the invention comprises an insulating support 4 having oppositely facing first and second major surfaces 6, 8, the first surface being referred to as the upper surface as viewed in the drawing. The support may be of any suitable insulating material such as a glass filled thermoplastic polyester.

A first plurality of plated-through holes 10 extend through the support on a first square grid and each hole contains a seamless contact socket 12. Each socket has a cylindrical collar portion 14 having an upper edge 16 which is adjacent to the first surface 6 of the insulating support. A plurality of convergent tynes 18 extend from the lower edge of the cylindrical collar portion and are flexed apart when a component lead 32 enters the contact socket as described below.

A second plurality of relatively smaller diameter holes 20 extend through the support on a second grid, the spacing of the second grid being the same as the spacing of the first grid and the second holes 20 being offset in the X and Y directions by an amount equal to one-half of the grid spacing. As a result, each first hole has an associated second hole which is offset from the first hole in the X and Y directions. Surface conductors 26 extend from each first hole to its associated second hole.

Each of the second plated-through holes 20 contains a pin 22, each pin having an upper end 24 which is proximate to the first surface of the support and a lower end 25 which is spaced from the second surface of the support. The pins are provided with barbs 27 so that they can be driven into the insulating support and will be thereby retained.

Figure 3:
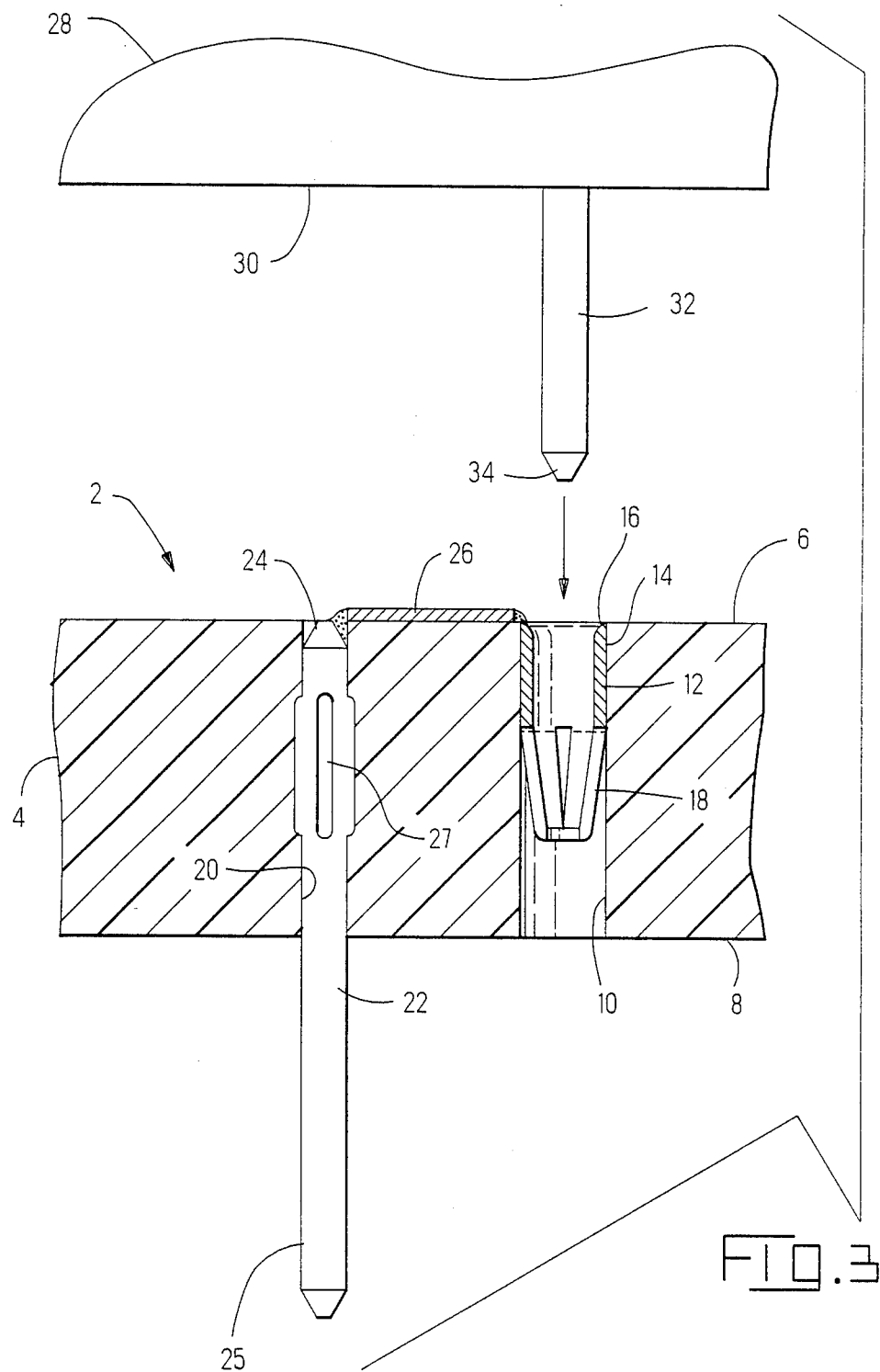
FIG. 3 is an enlarged sectional view looking in the direction of the arrows 3—3 of FIG. 1, this view showing portions of a component having a component lead in spaced relationship to the pin grid array.
Figure 4:
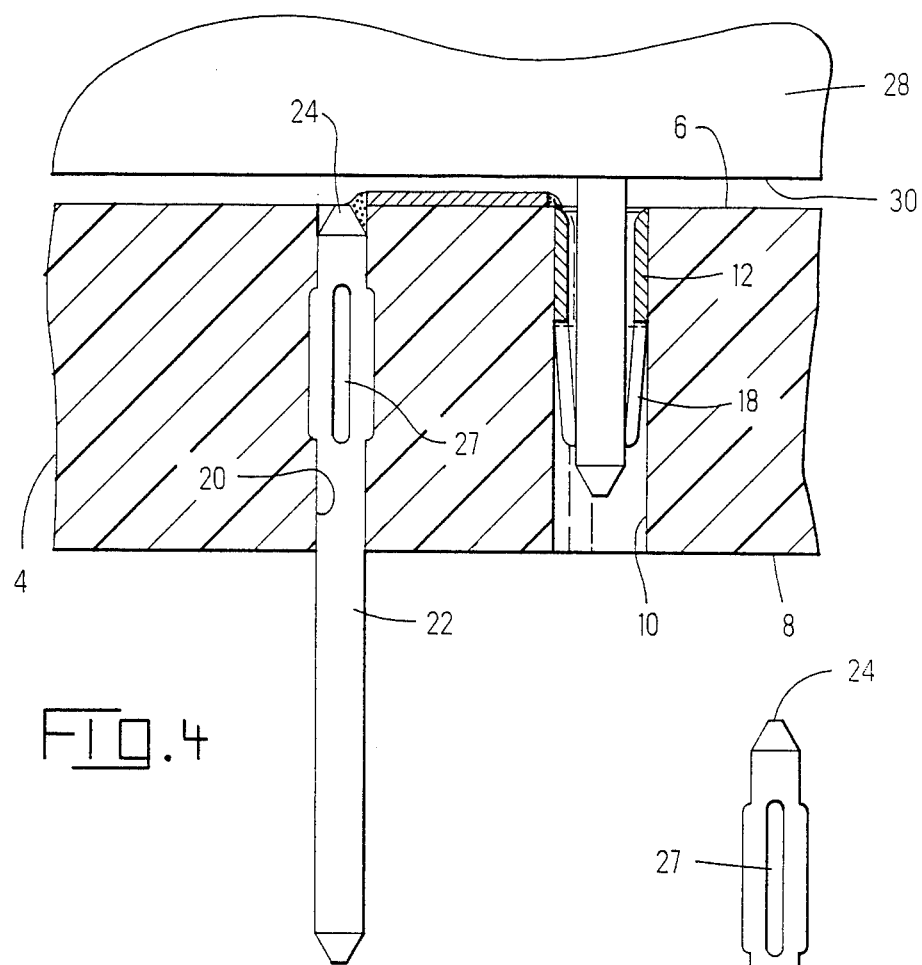
FIG. 4 is a view similar to FIG. 3, but showing the component coupled to the pin grid array.
Figure 5:
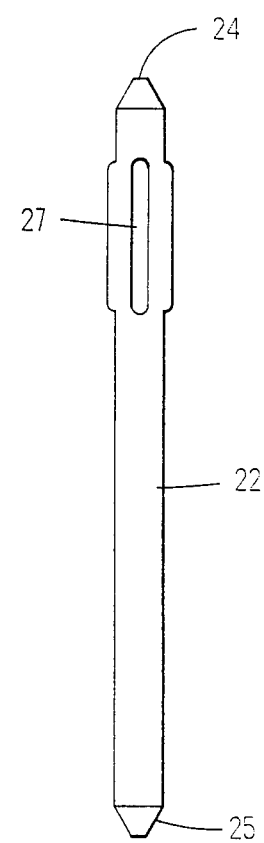
FIG. 5 is a view showing a post member.

When mounted on a circuit board, the pin grid array is adapted to be coupled to a component 28 having a component surface 30 which is opposed to the first or upper surface 6 of the insulator. When the component is moved downwardly from the position of FIG. 3 to the position of FIG. 4, the leads 32 of the component move into the first holes and through the socket contacts so that the free ends 34 of the leads are located well below the free ends of the tynes 18.

A primary advantage achieved in the practice of the invention is that when the pin grid array is installed on a circuit board, the distance between the upper surface of the circuit board and the first surface of the pin grid array is reduced, as compared with prior art devices, by a significant amount. For example, where the grid spacing is 0.100 inches, commonly available commercial pin grid arrays are designed such that the first surface of the pin grid array will be approximately 0.175 inches or even more above the surface of the circuit board. If a pin grid array in accordance with the present invention is used, this spacing can be reduced to approximately 0.125 inches under most circumstances. This lowering of the profile from 0.175 inches to 0.125 inches is desirable under virtually all circumstances and under some circumstances can be of extreme importance. Additional advantages are achieved in the practice of the invention. Some reduction in manufacturing costs can be achieved by virtue of the fact that it is unnecessary to provide a separate screw machine part, the outer cup or enclosure, for the socket and the screw machine part is replaced by a simple post member having barbs formed therein. Furthermore, the electrical connections between the post members and the socket members are achieved by reflow soldering in a suitable atmosphere rather than by any mechanical punching or other connection between the drawn or seamless socket contact and the shell. When the posts and the socket contacts have been inserted into the insulator, the parts are soldered in a suitable atmosphere and the surface conductors are each electrically connected by soldering to their associated post members and sockets.

The drawing shows a conventional pin grid array having a square insulating support and having the contact sockets on a square grid. The principles of the invention can be used in other connecting devices and the term pin grid array should therefore be interpreted as descriptive as a number of devices having the essential elements of the disclosed embodiment; namely, an insulating support and socket devices and posts contained in the support so that components can be connected to circuit board conductors.

I claim:

1. A pin grid array comprising a monolithic insulating support having oppositely facing first and second major surfaces, a first plurality of holes extending entirely through the support from the first surface to the second surface, the first holes being located on a first square grid, contact sockets in the first holes which are dimensioned to receive leads which extend from a component, and contact pins in the support extending from the second surface, each of the contact pins being electrically connected to an associated contact socket, the pin grid array being characterized in that:

a second plurality of holes are provided in the support, the second holes being located on a second square grid which is identical to the first grid and is offset, relative to the first grid, in the X and Y directions by amounts equal to one half of the grid spacing so that the second holes are offset from the first holes, each of the contact pins being mounted in one of the second holes, and surface conductors on one of the surfaces, each conductor extending from one of the first holes to an associated second hole, the conductors serving to connect each of the socket contacts to its associated pin contact.

2. A pin grid array as set forth in claim 1 characterized in that the contact sockets are seamless sockets, each socket having a collar portion and a plurality of convergent tynes extending from the collar portion, the collar portion having one circumferential edge which is adjacent to the first surface, the tynes extending towards the second surface.

3. A pin grid array as set forth in claim 1 characterized in that the first and second holes are plated through holes, the surface conductors, the contact pins, and the contact sockets being electrically connected by soldered connections.

4. A spin grid array as set forth in claim 1 characterized in that each of the contact pins has a diameter which is substantially equal to the diameter of the leads which are intended to be received in the contact sockets.

5. A pin grid array as set forth in claim 1 characterized in that the contact pins having diameters which are substantially within the limits of the leads which the contact sockets are capable of receiving.

6. A pin grid array as set forth in any one of the claims 1, 2, 3, 4, or 5 in combination with a component having a component surface and having leads extending from the component surface, each of the leads having a free end which is spaced from the component surface, the component surface being opposed to the first surface of the insulating carrier, each of the leads extending into one of the first holes and through the contact socket in the hole.

7. A pin grid array as set forth in claim 6 characterized in that the free ends of the leads are located beyond the second surface of the insulating carrier.

* * * * *